(12) United States Patent
Wiesner et al.

(10) Patent No.: US 9,910,098 B2
(45) Date of Patent: Mar. 6, 2018

(54) ARRANGEMENT FOR MEASURING A SINGLE CELL IN A RECHARGEABLE BATTERY PACK AND RECHARGEABLE BATTERY PACK COMPRISING SUCH AN ARRANGEMENT

(71) Applicants: Bernd Wiesner, Owen (DE); Tobias Beck, Beuren (DE)

(72) Inventors: Bernd Wiesner, Owen (DE); Tobias Beck, Beuren (DE)

(73) Assignee: Metabowerke GmbH (DE)

(*) Notice: Subject to any disclaimer, the term of this patent is extended or adjusted under 35 U.S.C. 154(b) by 0 days.

(21) Appl. No.: 15/439,108

(22) Filed: Feb. 22, 2017

(65) Prior Publication Data

US 2017/0160347 A1    Jun. 8, 2017

Related U.S. Application Data

(63) Continuation of application No. 13/698,711, filed as application No. PCT/EP2011/058138 on May 19, 2011, now abandoned.

(30) Foreign Application Priority Data

May 21, 2010   (DE) ........................ 10 2010 021 176

(51) Int. Cl.
*H02J 7/00*   (2006.01)
*G01R 31/36*   (2006.01)

(52) U.S. Cl.
CPC ................................ *G01R 31/3658* (2013.01)

(58) Field of Classification Search
CPC .... H02J 7/0021; H02J 7/0031; H01M 10/441; H01M 10/482; G01R 31/3606; G01R 31/3658
USPC ......... 320/122, 134, 136, 163, 164; 324/426
See application file for complete search history.

(56) References Cited

U.S. PATENT DOCUMENTS

| | | | |
|---|---|---|---|
| 5,543,245 A | 8/1996 | Andrieu et al. | |
| 5,883,495 A * | 3/1999 | Smith | H02J 7/0031 320/128 |
| 6,169,385 B1 | 1/2001 | Konishi et al. | |
| 2003/0044689 A1 * | 3/2003 | Miyazaki | H02J 7/0026 429/320 |

FOREIGN PATENT DOCUMENTS

| | | |
|---|---|---|
| CN | 100080 | 4/2014 |
| DE | 69837661 T2 | 12/2007 |
| EP | 1289096 A2 | 5/2003 |
| EP | 11723395.7 | 4/2016 |

\* cited by examiner

*Primary Examiner* — Edward Tso
*Assistant Examiner* — Aaron Piggush
(74) *Attorney, Agent, or Firm* — Randall Danskin P.S.

(57) ABSTRACT

An arrangement for measuring a single cell in a rechargeable battery pack is described, and which includes a plurality of cells coupled in a series circuit, and wherein adjacent cells are electrically coupled to a connecting branch, and a measuring device comprising a switch is provided, and which selectively electrically connects one connecting branch to a measuring input of the measuring device.

7 Claims, 3 Drawing Sheets

ARRANGEMENT FOR MEASURING A SINGLE CELL IN A RECHARGEABLE BATTERY PACK AND RECHARGEABLE BATTERY PACK COMPRISING SUCH AN ARRANGEMENT

CROSS REFERENCE TO RELATED APPLICATIONS

The present application is a Continuation Application of U.S. Application Ser. No. 13/698,711 filed on Nov. 30, 2012 which claims priority from German Application Serial No. 10 2010 021 176.1 and which was filed on May 21, 2010; and PCT Application Serial No. PCT/EP2011/058138 and which was filed on May 19, 2011 all by inventors Bernd Wiesner and Tobias Beck, both of Germany.

The invention relates to an arrangement for measuring a single cell in a rechargeable battery pack, and wherein the rechargeable battery pack comprises a series circuit composed of a plurality of cells, and wherein further two adjacent cells are electrically connected to one another by means of a connecting branch, and wherein the arrangement has a measuring device and which further comprises a switching device, and which is equipped to selectively connect exactly one connecting branch to a measuring input of the measuring device. The invention also relates to a rechargeable battery pack which has such an arrangement.

An arrangement for measuring a single cell having a switching device and a measuring device is generally known. With this arrangement, the measuring device is equipped for measuring an electrical potential relative to a minus pole of a series circuit of the cells. During a measuring cycle, the switching device successively connects the plus poles of the individual cells of the rechargeable battery pack to a measuring input of the measuring device. In this way, the electrical potential on the plus pole of the individual cells can be measured successively.

Every time the electrical potential on a particular plus pole is measured, a certain subset of the cells of the rechargeable battery pack is loaded with a certain measuring current. With the known arrangement, the mean measuring current varies from cell to cell. Within a measuring cycle, in which the electrical potential on the plus pole of each cell is measured, a different electrical charge is taken from each cell. Over the course of time, this causes the individual cells to become differently charged as a result of the measuring cycles, which can lead to a debalancing of the charge state of the individual cells. Particularly, and in the case where the rechargeable battery pack is neither discharged by a working load, such as an electric motor of an electrical device for example, nor charged by means of a charging circuit, this results in the fact that, due to the debalancing of the charge state of the individual cell as a result of the monitoring, a separate charging process is required to match the charging states of the individual cells to one another once more. This in turn leads to an increased number of charging cycles and therefore to increased wear of the individual cells of the rechargeable battery pack.

The present invention is therefore based on the object of specifying an arrangement for measuring a single cell, or a rechargeable battery pack in which such an arrangement is integrated, with which the debalancing of the charge state of the individual cells as a result of the measurements by means of the measuring device is at least substantially prevented.

The foregoing stated object is achieved by an arrangement for measuring cells of the kind mentioned in the introduction which is characterized in that the arrangement has at least one load arranged between two connecting branches. The load can selectively be brought into an activated operating state or into a deactivated operating state by means of a control signal such that electric charge can be taken from at least one cell during the activated operating state by means of the load.

In doing so, it can be provided that the arrangement has a control device which is equipped to generate the control signal for activating and deactivating at least one load, so that a non-uniform discharge of the cells as a result of a measuring current at the measuring input is at least substantially prevented when different connecting branches are successively connected to the measuring input. The control device can have a microcontroller with at least one digital output, for example, and wherein the digital output is connected to a drive input of the load.

It is particularly preferred that the at least one load is connected in parallel with exactly one cell. The load can therefore be connected to two adjacent connecting branches, and wherein the two adjacent connecting branches are connected to the plus pole and the minus pole respectively of the same cell.

In order to achieve a simple design of the arrangement, it is preferred that the measuring device is equipped for measuring a voltage between the measuring input and a reference point within the series circuit, and wherein the reference point is electrically connected to a terminal of the measuring device.

Further, it is preferred that all cells of the rechargeable battery pack belong to the series circuit and/or an outer end of the series circuit, and preferably a minus pole of an outer cell of the series circuit, forms the reference point. The reference point can therefore be a ground conductor of the arrangement, for example. The ground conductor can be connected to the minus pole of that cell of the series circuit whose minus pole is not connected to another cell. This ensures that the ground potential is the lowest potential within the series circuit, and the measuring device normally only has to measure positive potentials with respect to the ground potential.

In order to reduce the circuit complexity for the arrangement, it can be provided that a load is only associated with those cells which are indirectly connected to the reference point. In other words, no load is associated with that cell whose minus pole or plus pole is connected directly to the reference point, for example the ground conductor.

It is preferred that the load has at least one switching element which is electrically closed when the load is activated and electrically open when the load is deactivated, and wherein one of these switching elements simultaneously forms a switching element of the switching device. The at least one switching element can be a semiconductor switch, and preferably a bipolar transistor or a unipolar transistor. As one of the switching elements is used simultaneously for activating and deactivating the load and connecting a particular connecting branch to the measuring input, the number of components, and in particular transistors, which are required for building the arrangement for measuring cells, is kept low.

The load can be realized particularly easily in that the load has a series circuit comprising a semiconductor switch, such as a transistor for example, and a resistor. The resistor can be an adjustable resistor or a fixed resistor.

At the same time, it can be provided that the series circuit also has a semiconductor diode which is connected upstream or downstream of the resistor.

As a further solution which relates to the object specified, above, a rechargeable battery pack having an arrangement for measuring a single cell is proposed, and wherein the rechargeable battery pack comprises a series circuit composed of a plurality of cells, and wherein two adjacent cells are in each case electrically connected to one another by means of a connecting branch, and wherein the arrangement has a measuring device and further comprises a switching device, which is equipped to selectively connect exactly one connecting branch to a measuring input of the measuring device. This rechargeable battery pack according to the teachings of the present invention is characterized in that the arrangement has at least one load arranged between two connecting branches, and wherein the load can selectively be brought into an activated operating state or into a deactivated operating state by means of a control signal such that electric charge can be taken from at least one cell during the activated operating state by means of the load.

It is preferred that the arrangement for measuring a single cell of the rechargeable battery pack is in the form of an arrangement according to the invention as claimed in one of the claims as provided herewith. This enables the advantages of the arrangement according to the invention for measuring a single cell to be also realized for the rechargeable battery pack according to the invention. Further characteristics and advantages of the invention can be seen from the following description in which exemplary embodiments of the invention are described in more detail with reference to the drawings, In the drawings:

DETAILED DESCRIPTION

Figure 3:
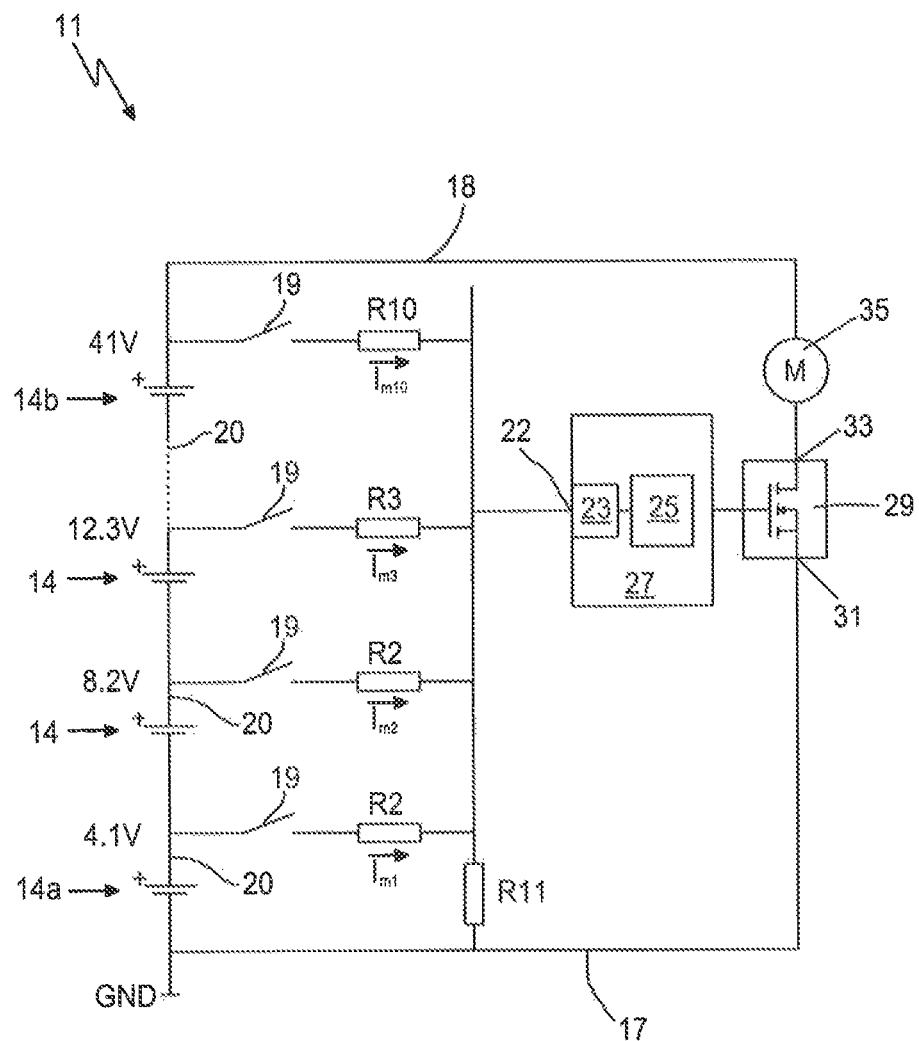
FIG. 3 shows an electrical device with a known arrangement for measuring a single cell.

The known electrical device 11 which is shown in FIG. 3 has a series circuit 13 composed of a plurality of cells 14 as an energy source. In the example as shown, ten cells 14 which are connected in series are provided. The number of cells 14 can, however, be varied as required. The minus pole of a first outer cell 14a, which is shown at the bottom of FIG. 3, is connected to a ground conductor 17 of the electrical device 11. The plus pole of a second outer cell 14b, of the series circuit 13, is connected to a supply voltage conductor 18 of the electrical device 11. The individual cells 14, 14a, and 14b are connected to one another by means of connecting branches 20, and wherein in each case, a connecting branch 20 connects the plus pole of a cell 14, and 14a to the minus pole of the respectively adjacent cell 14, and 14b. In the example as shown, the cells 14 are lithium ion rechargeable battery cells which have a nominal voltage of 4.1V, so that the overall series circuit 13 has a nominal voltage of about 41V. In FIG. 3, the electrical potential on the individual plus poles of the cells 14 is specified relative to a ground potential denoted by GND on the ground conductor 17.

The plus pole of each cell 14, 14a, and 14b is connected to a common measuring conductor 21 by means of a separate switching element 19, and a separate resistor R1, R2, R3, ..., R10. The measuring conductor 21 is also connected to the ground conductor 17 by means of a resistor R11. Furthermore, the measuring conductor 21 is connected to a measuring input 22 of an analog-digital converter 23 of a control device 27 which is made integral with the electrical device 11. An output of the analog-digital converter 23 is connected by means of an input to a microcontroller 25 of the control device 27. The control device 27 is designed so that the microcontroller 25 can activate and deactivate the separate switching elements 19, so that the appropriate plus poles of the individual cells 14, 14a, and 14b can be selectively connected via the corresponding resistors R1, R2, R3, ..., R10 to the measuring conductor 21, or alternatively, electrically isolated from the measuring conductor 21, respectively. The switching elements 19, therefore, belong to a switching device for selectively connecting exactly one individual cell 14, 14a and 14b to the measuring input 22.

An output of the control device 27 is connected to a control input of a power output stage 29 of the electrical device 11 in such a way that the microcontroller 25 is able to drive the power output stage 29. The power output stage 29 has a power switching element in the form of a semiconductor switch, for example, a MOSFET. A first terminal 31 of the power output stage 29 is connected to the ground conductor 17. A consumer of the electrical device 11 for example, an electric motor 35, is arranged between the supply voltage conductor 18, and a second terminal 33 of the power output stage 29, so that the consumer, that is to say the electric motor 35, can either be connected to the series circuit 13, or electrically isolated therefrom by means of the power switching element 19.

When the electrical device 11 is operating, the control device 27 regularly checks the state of the individual cells 14, 14a, and 14b by driving the switching elements 19 so that they are electrically activated individually in succession, that is to say, the plus poles of the individual cells 14, 14a, and 14b are connected successively to the measuring conductor 21 via the appropriate resistors R1, R2, R3, ..., R10. The resistors R1, R2, R3, ..., R10 which are electrically connected to the activated switching element 19, and the resistor R11, form a voltage divider, and wherein the center tap of which is connected to the measuring input 22 of the analog-digital converter 23. A voltage relative to the ground conductor 17 which is measured by the analog-digital converter 23, therefore, characterizes the potential on the plus pole of the particular cell 14, 14a, and 14b. Based upon the values measured by means of the analog-digital converter 23, the microcontroller 25, therefore, determines the potentials on the plus poles of the cells 14, 14a, and 14b, and from these calculates the voltages on the individual cells 14, 14a, and 14b by subtracting the electrical potentials on the plus poles of adjacent cells 14, 14a, and 14b. The electrical potential on the plus pole of the first outer cell 14a corresponds to its cell voltage, so that the aforementioned subtraction for calculating this cell voltage is not required.

In detail, the control device 27 carries out periodic measuring cycles for checking the individual cells 14, 14a, and 14b at regular intervals. In each measuring cycle, the control device 27 first electrically activates the switching element 19 which is connected to the resistor R1 in order to measure the electrical potential on the plus pole of the first outer cell 14a as shown at the bottom in FIG. 3. The control device 27 then electrically opens the switching element 19 once more and closes that switching element 19 which is connected to the plus pole of the adjacent cell 14, and which has not yet been activated in the measuring cycle under consideration. The switching elements 19 are therefore activated successively in turn.

In the course of the measuring cycle, this results successively in the measured currents $I_{m1}, I_{m2}, I_{m3}, \ldots, I_{m10}$ which flow through the respective resistors $R1, \ldots, R10$. As each switching element 19 is activated exactly once in the course of the measuring cycle, ten times the measured current $I_{m1}, \ldots, I_{m10}$ flows through the cell 14a shown at the bottom in FIG. 3, and whereas only one times the measured current $I_{m10}$ flows through the cell shown at the top in FIG. 3. As a result, considerably more charge is taken from the cell 14a, for example, during a measuring cycle as a result of the measurements than from the cell 14b say, thus resulting in variations in charge state of the individual cells 14, 14a, and 14b. In other words, there is a risk of debalancing the charge state of the individual cells 14, 14a, and 14b of the series circuit 13. The risk of debalancing exists particularly when the cells 14, 14a, and 14b of the series circuit 13 are not charged, or are only slightly charged, or are discharged, that is to say, when the electrical device 11 is not operated for a longer period but the cells are still monitored.

If the resistors R1 to R10 are sized so that the measured currents $I_{m1}$ to $I_{m10}$ have at least substantially the same magnitude, $I_{meas} = I_{m1} = \ldots = I_{m10}$, then the charge which is taken from the cell $i=1, \ldots, 10$ during a measuring cycle is:

$$Q_i = (11-i) * t_{meas} * I_{meas},$$

and where the time $t_{meas}$ corresponds to a measuring duration, that is to say, the time for which one of the switching elements 19 is electrically activated. The measured current, $I_{meas}$, corresponds to the current which flows through the respective switching element 19. Consequently, the mean value of a current through a particular cell i is:

$$I_{mean}, I = Qi/T,$$

and where the interval T, designates the duration of a whole measuring cycle. In both equations given, above, the index i designates the individual cells 14, 14a, and 14b. In doing so, the index, i=1, corresponds to the first outer cell 14a which is shown at the bottom in FIG. 3, and the index i=10 corresponds to the second, outer cell 14b which is shown at the top in FIG. 3. The further indices i=2, ..., 9 designate the cells 14, and which lie between the cells 14a, and 14b, namely, in the order from the bottom to top (referred to in the diagram as seen in FIG. 3).

If a measuring current $I_{meas} = I_{m1} = \ldots = I_{m10} = 0.41$ mA, and a measuring duration of $t_{meas} = 1$ ms are assumed, then, in one measuring cycle, a charge of $Q_1 = 4.1$ μAs is taken from the first outer cell 14a (i=1), and whereas only a charge of $Q_{10} = 0.41$ μAs is taken from the second outer cell 14b (i=10). If the measuring cycle is carried out once per second, then, as a result of the measurements, a charge of 354.24 mAs will be taken from the first outer cell 14a, and a charge of 35.42 mAs will be taken from the second outer cell 14b.

If the measuring cycles are carried out periodically at intervals of once per second, this results in a non-uniform electrical discharge of the individual cells, which can lead to a debalancing of the charge state of the individual cells 14, 14a, and 14b.

Figure 1:
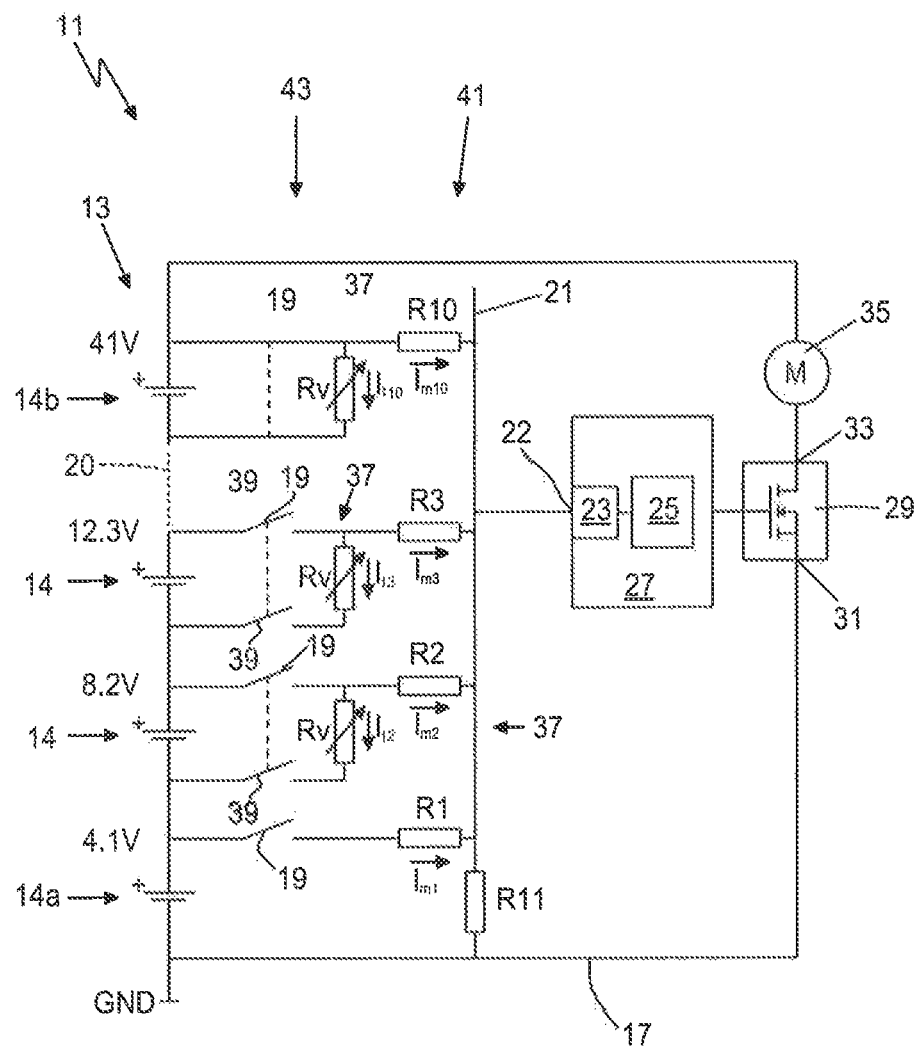
FIG. 1 shows a block circuit diagram of an electrical device with an arrangement for measuring a single cell according to a first preferred embodiment.

FIG. 1 shows the block circuit diagram of an electrical device 11, for example, an electric tool, with which the non-uniform discharge of the rechargeable battery cells 14, 14a, and 14b is at least substantially prevented. In the diagram as seen in FIG. 1, the same reference numerals are used for the same elements as seen in FIG. 3, and these elements are therefore not explained in significant detail, again. Unlike the known electrical device 11 as shown in FIG. 3, the electrical device 11 as shown in FIG. 1, includes a load 37, which the control device 27 can selectively electrically activate and deactivate, and which is further associated with each cell 14, and 14b, with the exception of the first cell 14a. The load 37 is connected to two adjacent connecting branches 20, that is to say, it is arranged in parallel with the appropriate cell 14, and 14b. Each load 37 is, therefore, arranged between the minus pole of the appropriate cell 14, and 14b, and a connecting point between the switching elements 19, and the respective resistor R1 and R2, . . . R10.

Each load 37 has a further switching element 39, and a load resistor $R_v$ which is connected in series therewith. The electrical device 11 is equipped so that exactly when a particular switching element 19 is electrically activated, the further switching element 39 associated with the same cell 14, and 14b is also activated. The control device 27 therefore, and at least substantially simultaneously electrically activates, and deactivates, the switching elements 19, 39.

The elements 19, R1, . . . , R10, $R_v$, 39, 21, R11 and 27 form an arrangement 41, for checking the individual cells 14a, 14, and 14b, for example, by measuring voltages on the individual cells 14a, 14, and 14b. With this arrangement 41 the loads 37 cause an additional current $I_{12}, \ldots, I_{110}$ to flow in addition to the actual measuring current $I_{meas} = I_{m1}, I_{10}$ in all the cells 14, and 14b apart from the first cell 14a, so that the individual cells 14a, 14, and 14b are uniformly electrically discharged during a measuring cycle. The value of the individual resistors $R_v$ is calculated so that at least substantially the same charge Qi, i=1, . . . , 10 is taken from each cell 14a, 14, and 14b in a measuring cycle. The load resistors $R_v$ can be adjustable resistors, for example, which are calibrated before the electrical device 11 is used for the first time. As an alternative to this, appropriately sized fixed resistors can also be provided for the load resistors $R_v$.

In order to achieve a uniform discharge of the individual cells 14, 14a, and 14b as a result of the measuring cycles, the second outer cell 14b must be loaded with a relatively large additional electrical current $I_{110}$, and whereas the first outer cell 14a does not have to be loaded with an additional electrical current. The additional electrical currents must, therefore, have values which increase in the order of the cells 14, 14a, and 14b in the series circuit 13 and which begin with the second cell (i=2), that is to say, $I_{12} < \ldots < I_{110}$. Accordingly, the values of the load resistors, $R_v$, must have correspondingly decreasing values.

It should be understood that the arrangement 41 is part of a rechargeable battery pack 43, which, apart from the arrangement 41, also contains the series circuit 13 of the cells 14a, 14, and 14b. The control device 27, with the analog-digital converter 23, and the microcontroller 25, can also be integrated in the rechargeable battery pack 43. In this case, however, a further control device (not shown) for driving the power output stage 29 can be provided in the electrical device 11, but outside the rechargeable battery pack 43.

Figure 2:
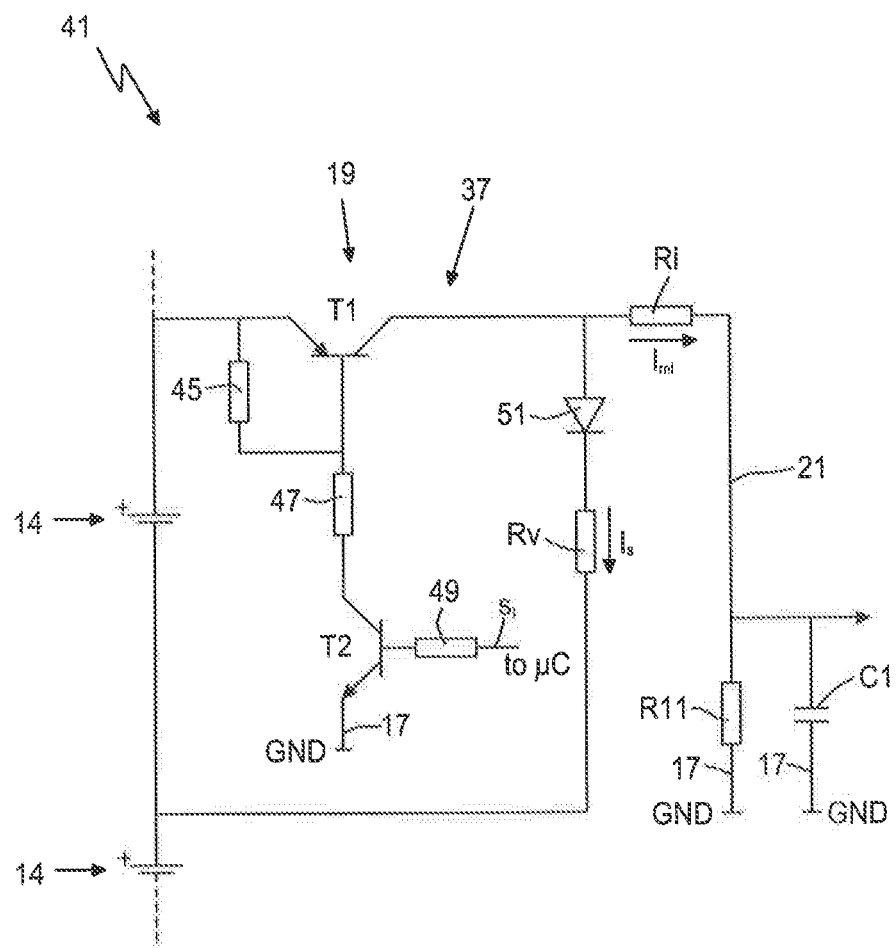
FIG. 2 shows a block circuit diagram of a detail of an arrangement for measuring a single cell according to a second preferred embodiment.

FIG. 2 shows a block circuit diagram of a portion of the arrangement 41 for measuring a single cell according to a further embodiment. The switching element 19 is in the form of a semiconductor switching element with bipolar transistors T1 and T2. The emitter of the PNP transistor T1 is connected to the plus pole of the appropriate cell 14. A collector of this transistor T1 is electrically connected to the measuring conductor 21 via the resistor R2, . . . , R10. A base-emitter resistor 45 is arranged between the base and emitter of the transistor T1. The base of the transistor T1 is also connected via a base resistor 47 to the collector of a drive transistor T2 and which is in the form of an NPN transistor. An emitter terminal of the drive transistor T2 is electrically connected to the ground conductor 17.

The base of the drive transistor T2 is electrically connected to a digital output of the microcontroller 25 via a series resistor 49, In each case, a switching element in the form of the transistor T1, and the associated drive circuit in the form of the transistor T2, and the resistors 45, 47, and 49 is associated with each cell 14, 14b, with the exception of the first outer cell 14a. Accordingly, for each drive transistor T2, the microcontroller 25 has a digital output which is electrically connected to the series resistor 49 of exactly one transistor T2, so that the microcontroller 25 can drive the transistors T2 separately from one another.

In the embodiment as seen in FIG. 2, the load 37 has a series circuit composed of a semiconductor diode 51, and the load resistor $R_v$. The transistor T1 is not only used to electrically connect connecting branches 20 to the measuring conductor 21 which is shown at the top of FIG. 2, but also is used to electrically activate and deactivate the load 37. That is to say, the transistor T1 not only forms the switching element 19 of the switching device, but at the same time is a switching element of the activatable and deactivatable load 37.

According to the embodiment of the invention as seen in FIG. 1, it is provided that the load 37 is only associated with the cells 14, and 14b, and not with the first outer cell 14a. Furthermore, in the embodiment of the invention which is shown in FIG. 2, a damping capacitor C1 is electrically connected in parallel with the resistor R11.

When the arrangement, 41, is in operation, by means of the digital outputs, the microcontroller 25 successively drives the individual drive transistors T2, so that they and the corresponding transistors T1 conduct, and a corresponding measuring current $I_{m1}, \ldots, I_{m10}$ is established, to which is added the additional current $I_{12}, \ldots, I_{m110}$ through the load 37, where appropriate. In doing so, in each case the microcontroller 25 outputs a control signal $s_i$, i=1, . . . , 10 via the digital outputs, by means of which the appropriate drive transistor T2, is driven. The control signal $s_i$ is a digital signal, which can assume two stable states, namely a low level (low), and a high level (high). The switching element 19 is activated exactly when the control signal $s_i$ is at the high level, The resistors R1, . . . , R10, R11 are preferably designed so that an electrical potential which is not greater than the electrical potential on the plus pole of the second cell 14—that is to say, on that cell 14 which is adjacent to the first outer cell 14a —is established at the measuring input 22, plus a forward voltage of that diode 51, which is associated with the second cell 14. This prevents transverse currents between the plus poles of the individual cells 14, 14b. In a preferred embodiment, the resistors R1, . . . , R10, R11 are sized so that the potential on the measuring input 22 is approximately 0V to 5V with respect to GND.

All in all, the present invention provides the arrangement 41 for measuring a single cell or the rechargeable battery pack 43, and which substantially prevents a non-uniform discharge, and therefore a debalancing of the charge state of the individual cells 14, 14a, and 14b as a result of the measurements on the individual cells 14a, 14 and 14b. As a result, the reliable operation of the individual cells 14, 14a, and 14b, or the rechargeable battery pack 43 is ensured, particularly when the cells 14, 14a, and 14b are neither electrically charged, nor discharged over a longer period, but are merely monitored by the arrangement 41.

The invention claimed is:

1. An arrangement for measuring a cell in a rechargeable battery pack comprising:
    a series circuit composed of a plurality of cells, and wherein two adjacent cells of the plurality of cells are electrically connected to one another by a connecting branch, and wherein the arrangement has a measuring device and further comprises a switching device which is equipped to selectively connect exactly one connecting branch to a measuring input of the measuring device, and wherein the arrangement has at least one load arranged between two connecting branches, such that the at least one load can selectively be brought into an activated operating state, or into a deactivated operating state by a control signal such that an electric charge can be taken from at least one cell of the plurality of cells during the activated operating state by the at least one load, and wherein the arrangement has a control device which is equipped to generate the control signal for activating and deactivating the at least one load, so that a non-uniform discharge of the plurality of cells as a result of a measuring current at the measuring input is substantially prevented when different connecting branches are successively electrically connected to the measuring input, and wherein each of the at least one load comprises a load resistor having a load value which is calculated so that substantially the same charge is taken from each cell of the plurality of cells during the activated operating state in a measuring cycle to avoid a non-uniform discharge of the plurality of cells during a complete measuring cycle.

2. A rechargeable battery pack with an arrangement for measuring a cell, comprising:
    a series circuit composed of a plurality of individual cells, and wherein two adjacent individual cells of the plurality of cells are electrically connected to one another by a connecting branch, and wherein the arrangement has a measuring device which comprises a switching device, which is equipped to selectively connect exactly one connecting branch to a measuring input of the measuring device, and wherein the measuring device is equipped to measure a voltage between the measuring input and a reference point within the series circuit, and wherein the reference point is electrically connected to a terminal of the measuring device, and wherein the arrangement has at least one load arranged between two connecting branches, and wherein the load can selectively be brought into an activated operating state, or into a deactivated operating state by a control signal such that an electric charge can be taken from at least one individual cell during the activated operating state by means of the at least one load, and wherein the arrangement has a control device to generate the control signal for activating and deactivating the at least one load, so that a non-uniform discharge of the individual cells as a result of a measuring current at the measuring input is substantially prevented when different connecting branches are successively connected to the measuring input, and wherein each of the at least one load comprises a load resistor having a load value which is calculated so that substantially the same charge is taken from each individual cell during a measuring cycle.

3. An arrangement for measuring a cell in a rechargeable battery pack comprising:
    a series circuit composed of a plurality of individual cells, and wherein two adjacent individual cells are electrically connected to one another by a connecting branch, and wherein the arrangement has a measuring device, that comprises a switching device which is equipped to selectively connect exactly one connecting branch to a measuring input of the measuring device, and wherein the measuring device is equipped for measuring a voltage between the measuring input, and a reference point within the series circuit, and wherein the reference point is electrically connected to a terminal of the measuring device, and wherein the arrangement has at least one load arranged between two connecting branches, such that the at least one load can selectively be brought into an activated operating state, or into a deactivated operating state by a control signal such that an electric charge can be taken from at least one individual cell during the activated operating state by the at least one load, and wherein the arrangement has a control device which generates the control signal for activating and deactivating the at least one load, so that a non-uniform discharge of the individual cells of the plurality of cells as a result of a measuring current at the measuring input is substantially prevented when different connecting branches are successively connected to the measuring input, and wherein each at least one load comprises a load resistor having a load value which is calculated so that substantially the same charge is taken from each individual cell during a measuring cycle, and wherein the at least one load has at least one switching element which is electrically closed when the at least one load is in the activated operating state, and electrically open when the at least one load is in the deactivated operating state, and wherein at least one of the switching elements of the at least one load simultaneously forms a switching element of the switching device.

4. The arrangement of claim 3 and wherein the at least one load causes current to flow from the individual cell being measured, in addition to the measuring current flowing from the individual cell, so that all of the individual cells in the rechargeable battery pack are uniformly electrically discharged during the measuring cycle.

5. The arrangement of claim 3 and wherein the calculated load value of the load resistor causes substantially the same charge to be withdrawn from each individual cell during the measuring cycle.

6. The arrangement of claim 3 and wherein the at least one load has a series circuit composed of a semiconductor diode electrically communicating with the load resistor.

7. The arrangement of claim 3 further comprising:
a damping capacitor within the circuit of the at least one load, and the damping capacitor is electrically connected in parallel with the resistor.

* * * * *